United States Patent [19]
Svilans

[11] Patent Number: 4,675,877
[45] Date of Patent: Jun. 23, 1987

[54] BRAGG DISTRIBUTED FEEDBACK SURFACE EMITTING LASER

[75] Inventor: Mikelis N. Svilans, Kanata, Canada

[73] Assignee: Northern Telecom Limited, Montreal, Canada

[21] Appl. No.: 701,839

[22] Filed: Feb. 14, 1985

[51] Int. Cl.⁴ .............................................. H01S 3/19
[52] U.S. Cl. ...................................... 372/96; 357/17; 372/45; 372/46; 372/47
[58] Field of Search ...................... 372/44, 45, 46, 47, 372/96; 357/17

[56] References Cited
U.S. PATENT DOCUMENTS
3,703,670 11/1972 Kunz ..................................... 357/17
3,983,509 9/1976 Scifres et al. ......................... 372/96

Primary Examiner—James W. Davie
Attorney, Agent, or Firm—Schwartz, Jeffery, Schwaab, Mack, Blumenthal & Evans

[57] ABSTRACT

A surface-emitting, light emitting device has a columnar active region of one direct bandgap semiconductor and an adjacent confining region of higher bandgap semiconductor. Contacts are made to the active and confining regions and a window is formed in the device in vertical alignment with the active region to permit light emission from the device. The semiconductors are doped to establish a pn junction within a carrier diffusion length of the heterojunction between the active and confining regions, the pn junction extending the length of the active region. In use, laser light is emitted along the axis of the columnar active region in response to current passing across the pn junction. The confining region is epitaxially grown with a compositional and refractive index periodicity causing Bragg distributed feedback (DFB) laser operation.

4 Claims, 1 Drawing Figure

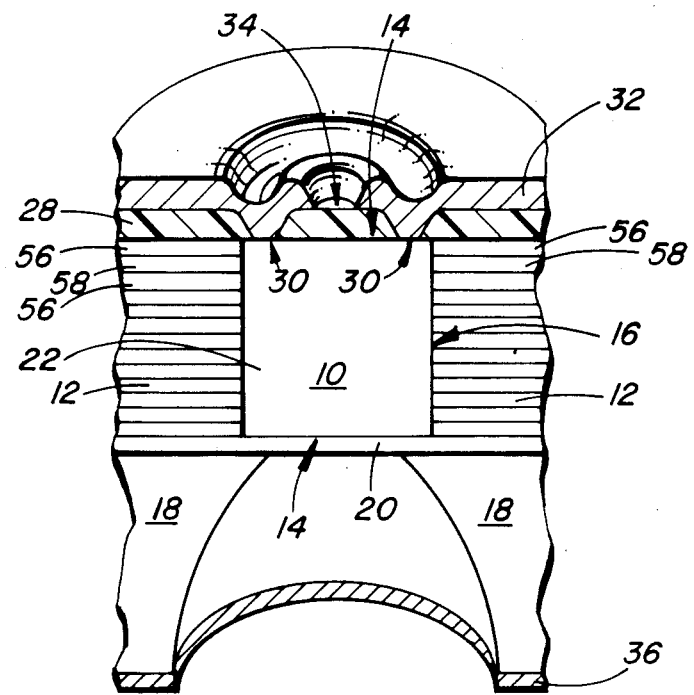

BRAGG DISTRIBUTED FEEDBACK SURFACE EMITTING LASER

BACKGROUND OF THE INVENTION

This invention relates to surface-emitting heterojunction laser/LED structures.

The importance of vertical laser emission for optoelectronic integration was recognized by, for example, K. Iga et al, 9th IEEE International Semiconductor Conference, 1984, Rio de Janeiro, Brazil, paper D3, p 52. Vertical laser emission is particularly important in constructing large emitting areas which can be made to have narrow beam angles and high power outputs. Several types of surface-emitting laser are known. Spring-Thorpe et al. International Electron Devices Meeting, (1977) Washington, D.C., p. 571, disclose a standard double heterostructure cavity transverse to current flow. The cavity is electrically pumped over most of its length and two additional mirrors are used to divert the laser beam towards the device surface. K. Iga et al. Electronics Letters, 19, #13 (1983) p. 457, disclose a surface-emitting laser having a cavity perpendicular to the surface but pumped over a short length of the cavity by a pn junction co-planar with the surface. Ito et al. Electronics Letters 20 #14 (1984) p. 577, elaborate on the Iga structure by elongating the cavity and introducing additional pumping along its length by a diffused homojunction.

In my co-pending patent application Ser. No. 673,644 there is described an alternative surface emitting device. The device has a columnar active region of one direct bandgap semiconductor and a surrounding confining region of a higher bandgap semiconductor. Contacts are made to the active and confining regions and a window is formed in the device in vertical alignment with the active region to permit light emission from the device. The semiconductors are doped to establish a pn junction within a carrier diffusion length of the heterojunction between the active and confining region, the pn junction extending the length of the active region. In use, light is emitted along the axis of the columnar active region in response to current passing radially across the pn junction.

Any of these surface emitting devices can have multilayered reflectors at the top and bottom of the vertically oriented active region. Alternatively the active region itself can be epitaxially grown to provide layers of varying composition and with layer thicknesses such that in operation wavelength dependent distributed feedback is provided. If the feedback occurs within the active region, such devices are termed distributed feedback lasers (DFB), whereas outside the active region they are generally referred to as distributed Bragg reflectors (DBR), see for example, IEEE Spectrum December, 1983, p. 43. Bragg distributed reflectors for surface emitting lasers are described by Ogura et al. "GaAs/Al$_x$Ga$_{1-x}$As Multilayer Reflector for Surface Emitting Laser Diode", Japanese Journal of Applied Physics, volume 22, No. 2, Feb. 1983, pp. L112-L114, while by Ogura et al. "Distributed Feed Back Surface Emitting Laser Diode with Multilayered Heterostructure", Japanese Journal of Applied Physics, Volume 23, No. 7, July 1984, pp. L512-L514 demonstrates the actual application to a laser device.

The Ogura et al. devices have multilayer semiconductors formed in the active region and at opposed ends of the active region. It may be disadvantageous to use distributed feedback in the active region if the layers of semiconductor material do not lend themselves to the application due to growth, technological or wavelength reasons. In addition, the material quality in the active region should be very high and may suffer as a result of multilayer growth. Monomode fiber applications amongst others require single longitudinal mode lasers of very narrow spectral width. A major problem presently is "chirp", the small but signicant variation in wavelength due to changing drive current. The drive current variation is caused by variation of the refractive index of the active region with carrier density. If the wavelength-determining mechanism (DFB) includes the active region, chirp is often apparent. However, if the wavelength-determining mechanism is outside the active region, chirp should be reduced.

In an alternative distributed feedback device according to the invention, a semiconductor laser diode has an active region of direct bandgap semiconductor material, a confining region of higher bandgap semiconductor material adjacent to the active region, the confining region having a series of layers of changing composition and refractive index, the series of layers epitaxially related to one another and to the active region, the layers located at least partly within a region of wave propagation of the laser and functioning in use to provide Bragg distributed optical feedback.

BRIEF DESCRIPTION OF THE DRAWINGS

The FIGURE is a longitudinal cross section of an embodiment of a surface emitting laser in accordance with the invention.

DETAILED DESCRIPTION OF THE PREFERRED EMBODIMENTS

An embodiment of the invention will now be described by way of example with reference to the accompanying drawing which is a non-scalar, longitudinal sectional view of a Bragg distributed feedback surface emitting laser.

Referring to the FIGURE, there is shown a light emitting device having a direct bandgap III-V semiconductor material constituting a device active region 10 and a wider bandgap III-V semiconductor material constituting a device confining region 12. The material in the active region 10 is p-type and the material in the confining region 12 is n-type. The device active region is of columnar shape and above and below it are partially reflecting mirrors 14.

In use, current is directed into the columnar active region 10 across a cylindrical pn junction 16, and into the n-type wider bandgap confining material 12 by electrical contacts 32 and 36. Current passing across the pn junction generates current carriers which are injected into the active region 10 in an energized state. When the carriers subsequently return to their low energy state light is emitted. The carriers and light are retained within the cavity since the material of the active region 10 is of a lower bandgap and higher refractive index than the material of the confining region 12. The light is partially reflected at the opposed mirrors 14, and partially reflected at periodic discontinuities in the confining region adjacent to the active region, thereby providing optical feedback.

The device has an n$^+$-type GaAs 100 micron thick substrate 18 doped to a level of $2.10^{18}$cm$^{-3}$. Epitaxially grown on an upper surface of the substrate is a 1 micron thick etch stop layer 20 of n-type $Ga_{1-x}Al_xAs$ (x=0.3) doped to a level of $1.10^{18}cm^{-3}$ and a 20 micron thick layer 22 of p-type GaAs doped to a level of $1.10^{17}cm^{-3}$. The layer 22 is etched to leave the column 10 of diameter 5 microns. Subsequently alternating layers 56, 58 of n-type $Al_yGa_{1-y}As$ (y=0.3) doped to a level of $2.10^{17}cm^{-3}$ and n-type $Al_zGa_{1-z}As$ (z=0.35) doped to a level of $2.10^{17}cm^{-3}$ are epitaxially grown on the substrate 18 and around the column 10 to a thickness approximately equal to the column height whereby the column 10 and the surrounding region 12 of n-type GaAlAs form a layer of approximately uniform thickness.

Subsequently an insulating layer 28 of $SiO_2$ is low pressure chemically vapor deposited on the upper surface of the epitaxially grown material to a depth of 2000 angstrom units. An annular window 30 is etched through the insulator 28 to the column 10 near the pn junction and zinc is diffused through it into the column top surface. Subsequently a top contact 32 of Pt/Ti/Au is low pressure chemically vapor deposited through a mask onto the top surface of the wafer except over a 3 micron diameter central region 34. In addition, a 1500 angstrom unit layer 36 of Au/Ge is low pressure chemically vapor deposited on the lower surface of the substrate 18. Using a $H_2O_2:H_2SO_4:H_2O$ etchant, a well is formed by etching through the bottom contact layer 36 and into the substrate 18 to the etch stop layer 20. GaAs does not transmit light at 0.84 microns, the emission wavelength of the GaAs device so the well obviates undue absorption of light emitted from the active region.

An important mode of operation of semiconductor lasers is single frequency (or equivalently, single longitudinal mode) operation. In standard lasers, optical feedback is accomplished with semiconductor-air or semiconductor-insulator reflecting interfaces, at opposed ends of the active region, these interfaces being relatively insensitive to the light wavelength. Single longitudinal mode operation is enhanced in the present device by wavelength dependent feedback. Although the emitted light is mainly confined to the active region, the region of wave propagation extends some way into the surrounding confining region where partial reflection takes place at the junctions between layers 56 and 58. The refractive index and thickness of the layers is so chosen that the partial reflections interfere constructively at a narrow band of wavelengths but not at wavelengths outside the band, according to the Bragg reflection principle.

In the illustrated device the Bragg distributed feedback property is introduced by the periodic compositional perturbations 56, 58 in the confining region. Molecular beam epitaxy (MBE) or organometallic vapor phase epitaxy (OMVPE) are crystal growth techniques capable of the necessary sub-micron layer thickness control. Epitaxial growth conditions are adjusted so as to grow the active region as alternating layers 56, 58 of narrower bandgap and wider bandgap materials, the compositional periodicity being of optical thickness $\lambda/2$ where $\lambda$ is the device output wavelength.

The nature of compositions and thicknesses of the alternating layers can be changed in accordance with known Bragg reflection theory to optimize optical gain, reflection, optical confinement and current confinement for devices of various dimensions. The compositional changes within the confining region contribute to optical feedback as long as they are within the region of wave propagation of the laser.

Although the device shown in the FIGURE is based on the ternary GaAs/GaAlAs III-V system having an output wavelength of the order of 0.84 microns, the device can be fabricated in other semiconductor systems such as the InP/InGaAsP quaternary system or the group II-VI semiconductor material HgCdTe.

In the embodiment described the p-contact 32 is made to the top of the active region 10 and the n-contact 36 is made to the confining region at the substrate bottom surface. In an alternative contact scheme (not shown) the p and n contacts are made as spaced contacts to the wafer top surface.

As indicated previously it is known to introduce the Bragg distributed feedback property in the active region by growing a series of layers of different composition. Similarly it is known to epitaxially grow an interference mirror in general alignment with the active region, these being called Bragg distributed reflectors. It will be appreciated that Bragg distributed feedback or Bragg distributed reflector layers can be grown within the active region and at its ends in addition to growing the confining region as a multilayer. In this case the distributed feedback from the confining region provides only part of the total optical feedback and reflection.

What is claimed is:

1. In a distributed feedback laser comprising an active region of a direct bandgap semiconductor material, a confining region of a higher bandgap semiconductor material adjacent the active region to form a heterojunction between the active and confining regions, and first and second contacts formed respectively on said active and confining regions, the confining region having a series of layers of changing composition and refractive index, the series of layers being epitaxially related to one another and to the active region, with the layers being located at least partly within a region of wave propagation of the laser so that the layers function to provide Bragg distributed optical feedback.

2. A surface-emitting laser as claimed in claim 1 in which the layers of said confining region are formed of group III-V material containing at least two group III elements wherein the content ratio of the elements changes from layer to layer.

3. A surface-emitting laser as claimed in claim 1 in which the series of layers of said confining region has a compositional periodicity of optical thickness $\lambda/2$ where $\lambda$ is the device output wavelength.

4. A surface emitting laser as claimed in claim 1 in which the active region is columnar, the confining region extends around at least a part of the active region and the laser emits along the axis of the columnar active region.

* * * * *